(12) United States Patent
Meng-fan et al.

(10) Patent No.: US 9,170,287 B2
(45) Date of Patent: Oct. 27, 2015

(54) 3D-IC DIFFERENTIAL SENSING AND CHARGE SHARING SCHEME

(75) Inventors: Chang Meng-fan, Taichung (TW); Huang Tsung-hsien, Hsinchu (TW)

(73) Assignee: NATIONAL TSING HUA UNIVERSITY, Hsin Chu (TW)

(*) Notice: Subject to any disclaimer, the term of this patent is extended or adjusted under 35 U.S.C. 154(b) by 472 days.

(21) Appl. No.: 13/541,590

(22) Filed: Jul. 3, 2012

(65) Prior Publication Data
US 2013/0214761 A1  Aug. 22, 2013

(30) Foreign Application Priority Data

Feb. 21, 2012  (TW) ............................. 101105639 A

(51) Int. Cl.
*G01R 25/00* (2006.01)
*G01R 31/28* (2006.01)
(52) U.S. Cl.
CPC ............ *G01R 25/00* (2013.01); *G01R 31/2853* (2013.01)
(58) Field of Classification Search
CPC ............ G01R 25/00; H01L 2924/0002; H01L 2924/00
USPC ........................................................ 324/76.11
See application file for complete search history.

(56) References Cited

U.S. PATENT DOCUMENTS

| | | | | |
|---|---|---|---|---|
| 6,643,204 B1* | 11/2003 | Agrawal | .................... | 365/210.1 |
| 7,812,459 B2* | 10/2010 | Yu et al. | ........................ | 257/778 |
| 7,969,193 B1* | 6/2011 | Wu et al. | ........................ | 326/82 |
| 2010/0153043 A1* | 6/2010 | Su et al. | ........................ | 702/71 |
| 2011/0080185 A1* | 4/2011 | Wu et al. | .................... | 324/750.3 |

OTHER PUBLICATIONS

IEEE, Journal of Solid-State Circuits, vol. 45, No. 1, Jan. 2010, entitled: "8 GB 3-D DDR3 DRAM Using Through-Silicon-Via Technology".

* cited by examiner

*Primary Examiner* — Arleen M Vazquez
*Assistant Examiner* — Brent J Andrews
(74) *Attorney, Agent, or Firm* — Chih Feng Yeh; Huntington IP Consulting Co., Ltd.

(57) ABSTRACT

The present invention discloses a 3D-IC differential sensing and charge sharing scheme which includes a plurality of TSVs including a first TSV and a second TSV. A tracking circuit is coupled to the first TSV. A sensing circuit is coupled to the second TSV and the tracking circuit. A plurality of equaling circuits are provided and wherein each of equaling circuit is configured and electrically connected between adjacent two equaling circuits. A clamping circuit is coupled to the first TSV.

12 Claims, 7 Drawing Sheets

3D-IC DIFFERENTIAL SENSING AND CHARGE SHARING SCHEME

TECHNICAL FIELD

The present invention generally relates to a 3D stacked chip device, and especially relates to a 3D-IC differential sensing and charge sharing scheme and method.

BACKGROUND

Recently, portable electronic equipment such as mobile telephones and non-volatile semiconductor memory media such as IC memory cards have been downsized, and there have been increasing demands for reducing the number of parts used in the equipment and media and downsizing thereof. Therefore, in the semiconductor industry, packaging technologies for integrated circuits (ICs) have been advancing to meet requirements for miniaturization and mounting reliability. For example, the requirement for miniaturization results in acceleration of technological development for a package having a similar size in relation to a semiconductor chip. Further, the requirement for mounting reliability places importance on packaging technologies that are capable of enhancing efficiency of a mounting process and improving mechanical and electrical reliability after the mounting process is completed. Thus, there have been considerable activities in the development of efficiently packaging a semiconductor chip. As packages that meet the demands, there are a chip scale package (CSP) having a package size substantially equal to that of the semiconductor chip, a multi-chip package (MCP) in which multiple semiconductor chips are incorporated into a single package, and a package-on-package (POP) in which multiple packages are stacked and combined into a single-piece member.

In pace with the development of technology, in response to an increase in storage capacity required for memory and the like, stacked type semiconductor devices (multichip devices) have been proposed which have semiconductor integrated circuit chips stacked together. Namely, there is provided a stacked type semiconductor device formed of at least two semiconductor integrated circuit devices stacked, each having a specification and including a semiconductor integrated circuit chip, wherein each of the semiconductor integrated circuit devices includes a conductor that penetrates the semiconductor integrated circuit device, and the semiconductor integrated circuit devices are electrically connected by the conductors and a value of the specification, excluding a size, of the uppermost semiconductor integrated circuit device or the lowermost semiconductor integrated circuit device is maximum or minimum. Consequently, the stacked type semiconductor device has a plurality of chips stacked in a vertical direction. In the stacked type semiconductor device, the chips are electrically connected together via, for example, through plugs that penetrate the chips. Thus, to select a desired one of the stacked memory chips of the same structure is an important task. If a stacked type semiconductor device is manufactured, chips may be individually subjected to operation tests so that only normal chips can be sorted out and stacked.

One of the technologies to offer vertical connection is called Through-Silicon-Via (TSV) which has emerged as a promising solution in 3-D stacked devices. It is a technology where vertical interconnects are formed through the wafer to enable communication among the stacked chips. One of the related article may refer to IEEE, JOURNAL OF SOLID-STATE CIRCUITS, VOL. 45, NO. 1, January 2010, entitled: "8 Gb 3-D DDR3 DRAM Using Through-Silicon-Via Technology". In the article, a 3-D DRAM with TSVs is proposed which overcomes the limits of conventional module approaches. It also discloses how the architecture and data paths were designed. 3-D technologies including TSV connectivity check and repair scheme, and power noise reduction method are also disclosed. TSVs can be formed simply after fab-out so that no special process integration during the normal process flow is required. Chip identification (ID) is typically assigned.

In data communication systems, it typically utilizes a transmitting device that operates under control of a first clock and an independent receiving device that operates under control of a second clock. In general, the transmitting device and the receiving device have a clock rate difference. This clock rate difference causes the receiver to see the incoming data at either faster or slower than expected, hereafter referred to as "timing drifting". For packet based communication systems, if the amount of the maximum possible timing drift during the packet is much smaller than a symbol period, then this clock rate difference can be ignored. U.S. Pat. No. 7,003,056 disclosed a symbol timing tracking and method, and it uses timing tracking to correct timing drifting due to the difference in frequency of a transmitter clock and a receiver clock. With the timing tracking, correlation values of three consecutive samples are calculated using the receive signal and the recovered symbols and then summed. Further, SRAMs are widely used in applications where speed is of primary importance, such as the cache memory typically placed proximate to the processor or Central Processing Unit (CPU) in a personal computer. However, the timing of its internal circuitry may critically affect the speed and efficiency of the SRAM. For example, the bit line pre-charge interval comprises an appreciable portion of the read/write cycle time, and sense amplifier usage contributes significantly to the overall power consumption of the SRAM. In early SRAM memory designs, all read/write cycle timing was based on an externally generated clock signal. Another related art disclosed in U.S. Pat. No. 6,643,204 which includes self-time circuit for reducing the write cycle time in a semiconductor memory. A "dummy" memory cell having the same timing requirements as the functional cells, and associated write logic are added to the standard circuitry of the memory device. The dummy write cell receives the same control signals used to write data to the functional cells of the memory, and is configured to issue a completion signal when a write access is concluded, causing the write cycle to be terminated. The circuit and method permits write cycle time to be reduced to the lowest practical value, independently of the read cycle time. This potentially increases the overall operating speed of the memory device.

The present invention provides a differential sensing method for 3D stacked device to improve the loading issue. The delay caused by the loading issue is worse to the higher level chip layers. Moreover, in a traditional three-dimensional chip system, based-on the large number input/output (I/O) of the circuit, pre-charge of TSV consume lots of power. Therefore, the present invention provides a novel 3D-IC differential sensing and charge sharing scheme and to solve these issues.

SUMMARY OF THE INVENTION

An aspect of the present invention is to provide a 3D-IC differential sensing and charge sharing scheme and method.

A 3D-IC differential sensing and charge sharing scheme comprises a plurality of high loading structures, including a first high loading structure a second high loading structure. A tracking circuit is coupled to the first high loading structure. A sensing circuit is coupled to the second high loading structure and the tracking circuit. A plurality of equaling circuits is provided, each of the plurality of equaling circuits is arranged between an adjacent two high loading structures of the plurality of high loading structures and coupled thereof. A clamping circuit is coupled to the first high loading structure. As voltage of the TSV exceeds a specified range, a detecting circuit or a control circuit activates the sensing circuit.

The high loading structures is a TSV. The tracking circuit includes a pair of dummy bit line and at least one tracking unit, and the at least one tracking unit includes a plurality of MOS transistors. The clamping circuit includes two sense amplifiers, and the two sense amplifiers include a first sense amplifier and a second sense amplifier. A third terminal of the first sense amplifier and the second sense amplifier is electrically connected to the first high loading structure, and a second terminal of the first sense amplifier electrically connected to a first terminal of the second sense amplifier.

According to another aspect of the present invention, it provides a 3D-IC differential sensing and charge sharing scheme, comprising a high loading structure. A sensing circuit is coupled to the high loading structure. An equaling circuit is coupled to a positive input terminal and a negative input terminal of the sensing circuit, and coupled to the high loading structure. A capacitor is coupled to one terminal of the equaling circuit and the negative input terminal of the sensing circuit for storing charge.

According to yet another aspect of the present invention, it provides a method for charge-sharing of 3D-IC, comprising equaling all TSV signals. Then, it performs a step opening a clamping circuit, and comparing a voltage of a first TSV of the all TSV. Next, if said voltage of said first TSV exceeds a specified range, then sending a pulse control signal for precharging to the first TSV, and thereby supplementing charge in a circuit to maintain a first voltage. Finally, it performs a step of opening a sensing circuit to output a sensing data or signal, and thereby determining a digital status as one or zero.

BRIEF DESCRIPTION OF THE DRAWINGS

The components, characteristics and advantages of the present invention may be understood by the detailed descriptions of the preferred embodiments outlined in the specification and the drawings attached.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1:
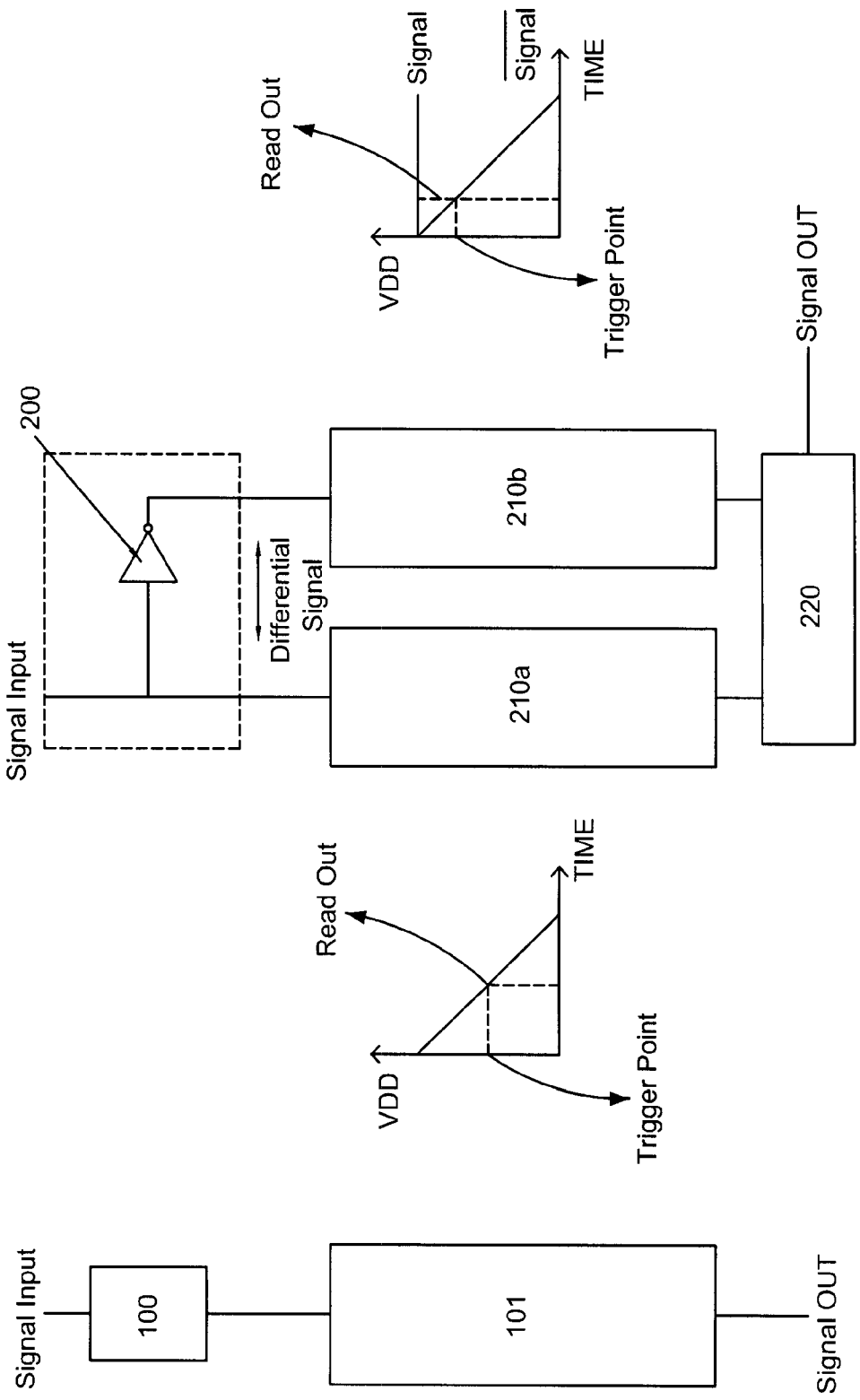
FIG. 1 illustrates a functional diagram of the differential sensing and TSV timing control scheme for 3D-IC according to the present invention.

The present invention generally relates to a 3D-IC differential sensing and charge sharing scheme which can be introduced to an embedded volatile or nonvolatile memory. In a preferred embodiment of the present invention, a 3D-IC differential sensing and TSV timing control scheme is provided, as shown in FIG. 1. The differential sensing scheme includes a drive or buffer 100 coupled to a first high loading structure 101. A signal input is coupled to another terminal of the drive (buffer) 100, a signal output is electrically connected to the first high loading structure which can be formed by TSV 101. The scheme further includes a second high loading structure (TSV) 210a and a third high loading structure (TSV) 210b, both of the second TSV 210a and the third TSV 210b may be arranged in a parallel scheme for design consideration. Other configuration is also available. The signal input is coupled to the second TSV 210a and an inverter 200 is arranged between the signal input and the third TSV 210b. Subsequently, a sensing circuit 220 is coupled to both of the second TSV 210a and the third TSV 210b, respectively. The signal out is coupled to another terminal of the sensing circuits 220. It also shows the VDD-timing diagram as set in FIG. 2 for the differential sensing scheme, respectively. For the first TSV 101, the trigger point is at the half of the VDD, if the trigger point is extended horizontally to reach the point A of the VDD-timing diagram, the read out time is the cross point between the time axis with the vertical extending line from point A. Similarly, for the second TSV 210a and the third TSV 210b, the sensing margin is higher than the trigger point, namely, higher than the half VDD. Therefore, the read out will be over the line of VDD-time, which is between the signal line and the line of VDD-time.

Figure 2:
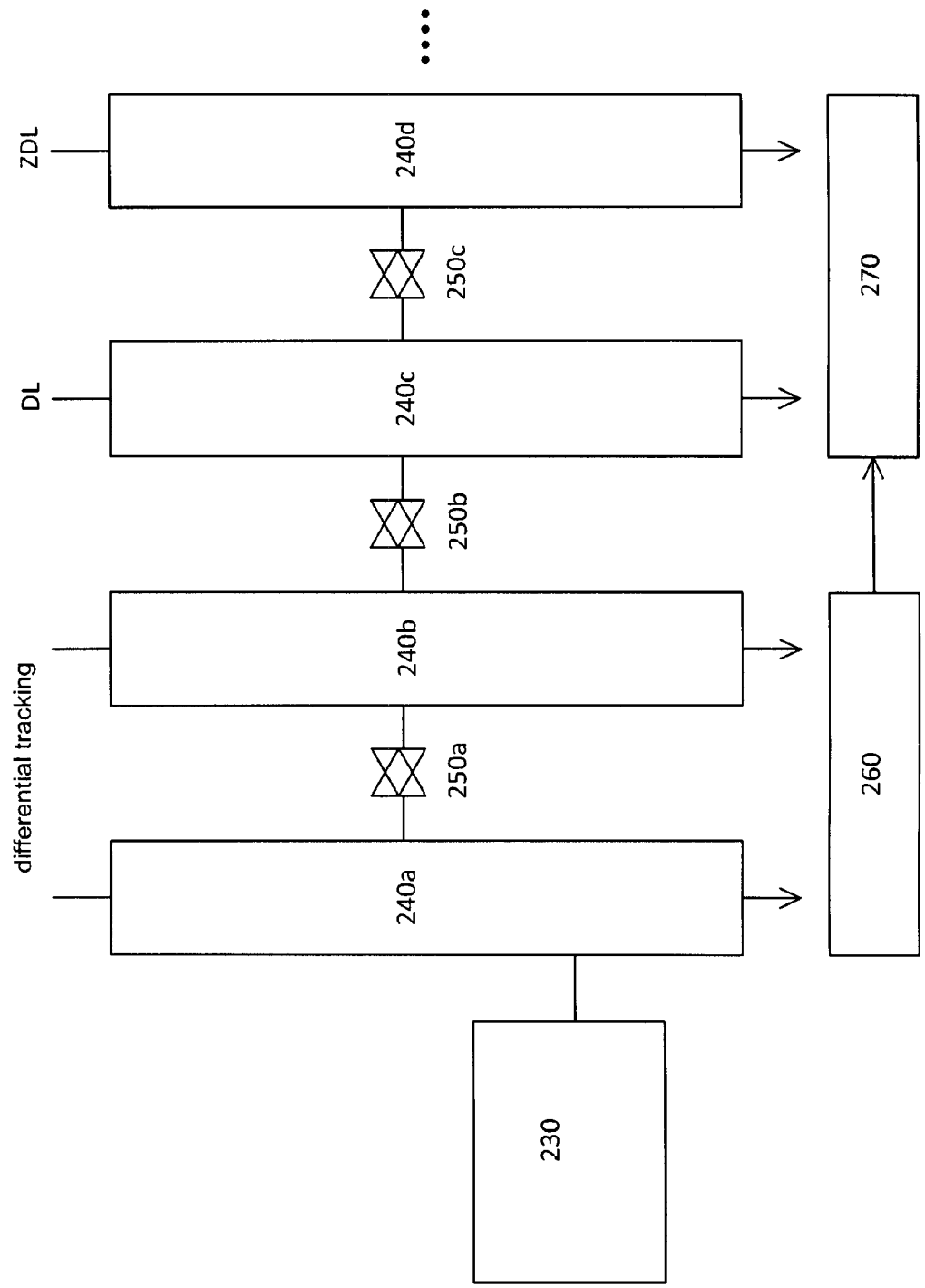
FIG. 2 illustrates a functional diagram of the 3D-IC differential sensing and charge sharing scheme according to the present invention.

As shown in FIG. 2, it shows a 3D-IC differential sensing and charge sharing scheme according to the present invention. In this embodiment, the 3D-IC differential sensing and charge sharing scheme includes a differential tracking signal structure. The differential tracking signal structure includes a pair of high loading structures. In one example, the pair of high loading structures can be formed by a pair of TSV (Through-Silicon Via) 240a and TSV 240b, and the pair of the TSV 240a and the TSV 240b are coupled to the signal input, respectively. It should be noted that an equaling circuit 250a is arranged between the TSV 240a and the TSV 240b. In other words, the differential tracking signal structure includes a first high loading structure, which includes for example two structures, indicated as 240a and 240b, coupled to a tracking circuit 260. One differential tracking signal input is coupled to one terminal of the first high loading structure 240a, 240b, and the tracking circuit 260 is coupled to another terminal of the first high loading structure 240a, 240b. The first high loading structures 240a, 240b can be formed by a pair of TSV. For design consideration, the first TSV 240a, 240b can be arranged parallel. In an example, the first TSV 240a, 240b are used as a dummy TSV pair. Between of the first high loading structures 240a and 240b can be arranged and coupled to the equaling circuit 250a.

The 3D-IC differential sensing and charge sharing scheme of the present invention further includes a second high loading structure, which includes for example two structures, indicated as 240c and 240d, coupled to a sensing circuit 270. The sensing circuit 270 to each TSV of the second high loading structure, respectively. One differential tracking signal input is coupled to one terminal of the second high loading structure 240c, 240d, and the sensing circuit 270 is coupled to another terminal of the second high loading structure 240c, 240d. Similarly, the second high loading structures 240c, 240d can be formed by a pair of TSV. For design consideration, the second TSV 240c, 240d can be arranged parallel or by other type configuration. Between of the first high loading structure 240b and the second loading structure 240c can be arranged and coupled to the equaling circuit 250b, between of any adjacent two second loading structures can be arranged and coupled to an equaling circuit. In FIG. 2, between of the second high loading structure 240c and the second loading structure 240d can be arranged and coupled to an equaling circuit 250c. The tracking circuit 260 is coupled to the sensing circuit 270. In a preferred embodiment, input signal of the differential tracking is substantially the same as that of the differential sensing. Moreover, 3D-IC differential sensing and charge sharing scheme of the present invention further includes a clamping circuit 230 coupled or electrically connected a dummy TSV (dummy loading), for example coupled to the first high loading structure 240a. The signal out is coupled to another terminal of the sensing circuits 270.

In one example, the tracking circuit 260 comprises a pair of dummy bit line and a plurality of tracking units. The tracking circuit 260 can receive and delay the control signal. A control circuit (not shown) may be coupled between the track circuit 260 and an input/output circuit to receive the delay control signal and generate a clock signal for the input/output circuit. The control circuit is for example an inverter. The signal through the inverter will be inverted from the initial input signal and be delay. In one example, the tracking unit comprises a plurality of MOS transistors, for example six transistors including two PMOS transistors and four NMOS transistors.

Figure 3:
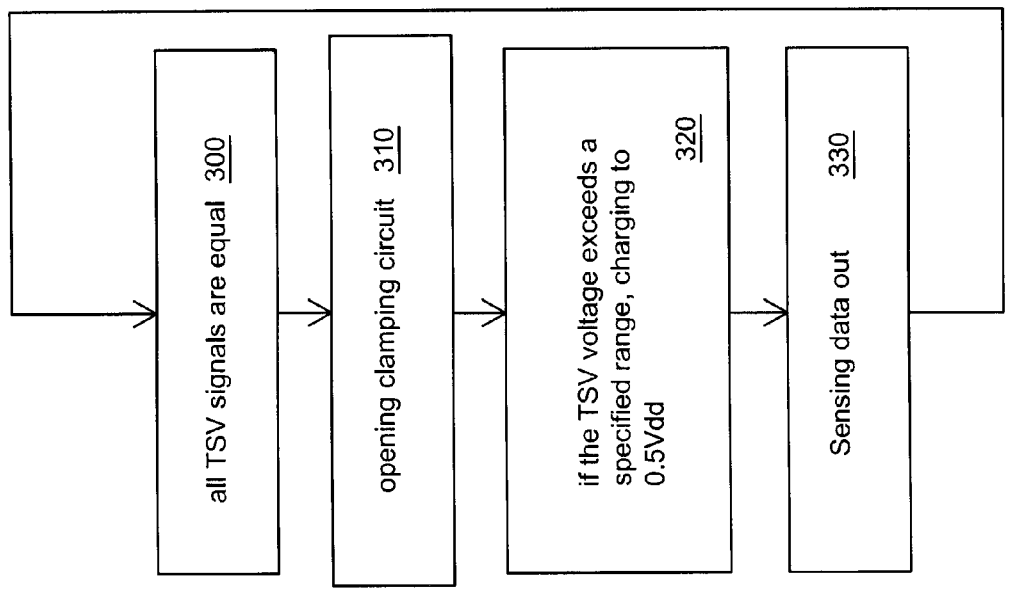
FIG. 3 illustrates a preferred embodiment of the charge-sharing flow of the 3D-IC scheme according to the present invention.
Figure 4:
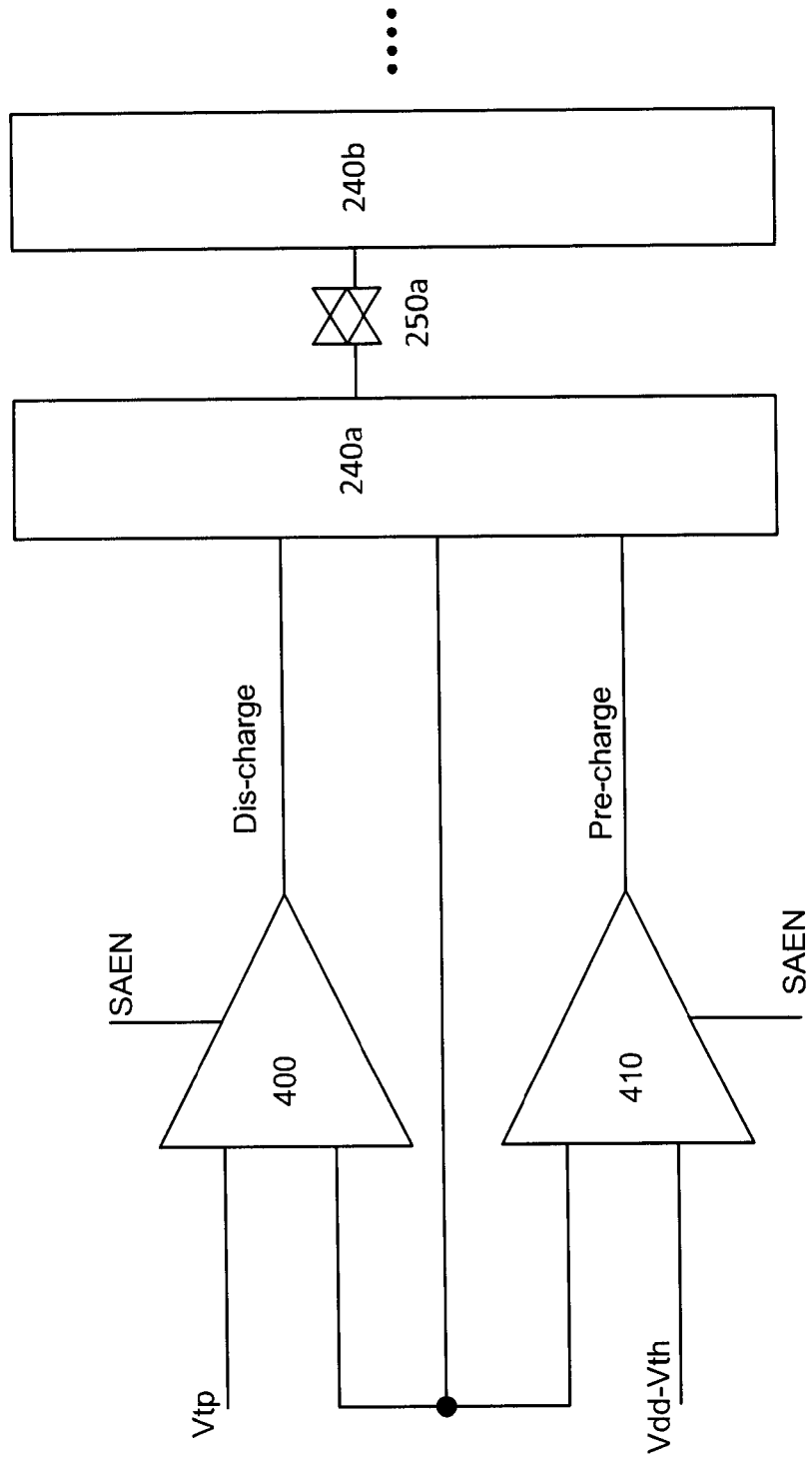
FIG. 4 illustrates a clamping circuit of the 3D-IC differential sensing and charge sharing scheme according to the present invention.

As shown in FIG. 3, it shows a preferred embodiment of the charge-sharing flow of the 3D-IC scheme of the present invention. Firstly, in step 300, all TSV signals are equal. The TSV signals include a differential tracking signal and a differential sensing signal. The sensing circuit 270 is normally closed. Next, in step 310, opening the clamping circuit 230 is performed. In one example, the clamping circuit 230 includes two sense amplifiers 400 and 410, shown in FIG. 4. Moreover, in another example, the clamping circuit 230 further includes a coupling capacitor, a current generator and a comparator. A lower level input signal ($V_{in}$) is clamped to a pre-determined reference voltage level ($V_{ref}$) by the clamping circuit 230. In FIG. 4, the third terminal of the sense amplifiers 400 and 410 is electrically connected to the first TSV 240a, respectively. The first terminal (such as positive input) of the sense amplifier 400 is electrically connected to an input terminal voltage $V_{tp}$. The second terminal (such as negative input) of the sense amplifier 400 is electrically connected to the first terminal (such as positive input) of the sense amplifier 410, and a node is arranged between the second terminal of the sense amplifier 400 and the first terminal of the sense amplifier 410 for coupling to the first TSV 240a. The terminal voltage $V_{dd}-V_{th}$ is output from the second terminal (such as negative input) of the sense amplifier 410. In such clamping circuit 230 scheme, it performs these process including opening the clamping circuit 230, utilizing two sense amplifier and comparing TSV voltage with $V_{dd}-V_{th}$ and $V_{tp}$ (such as by a comparator).

Subsequently, in step 320, if the TSV voltage exceeds a specified range, for example less than $V_{tp}$ or higher than $V_{dd}-V_{th}$, then sending a pulse control signal (such as by the control circuit) for pre-charging to the TSV structure, and thereby supplementing charge in a circuit to maintain the voltage about $0.5V_{dd}$. In another example, the TSV voltage is within a specified range which may be dis-charging via the TSV structure.

Above mentioned to maintain a stable voltage $0.5V_{dd}$ is achieved because the present invention to provide an equaling (balancing) circuit 250a, which the main purpose and function are capable of equaling (balancing) the output voltage of the sense amplifier 400, 410. In one example, when switching signal source, the variable gain of the sense amplifier 400, 410 will be changed correspondingly. However, when changing the gain, offset voltage will inevitably impact the output voltage, and thereby producing fluctuation. Therefore, the equaling (balancing) circuit of the present invention can conduct an equaling (balancing) voltage function for the sensing amplifier with variable gain.

Finally, in step 330, it is opening the sensing circuit 270 to output sensing data or signal, and thereby determining the digital status as one or zero.

In a preferred embodiment, the sensing circuit 270 may be a sense amplifier, a comparator or an operational amplifier.

Figure 5:
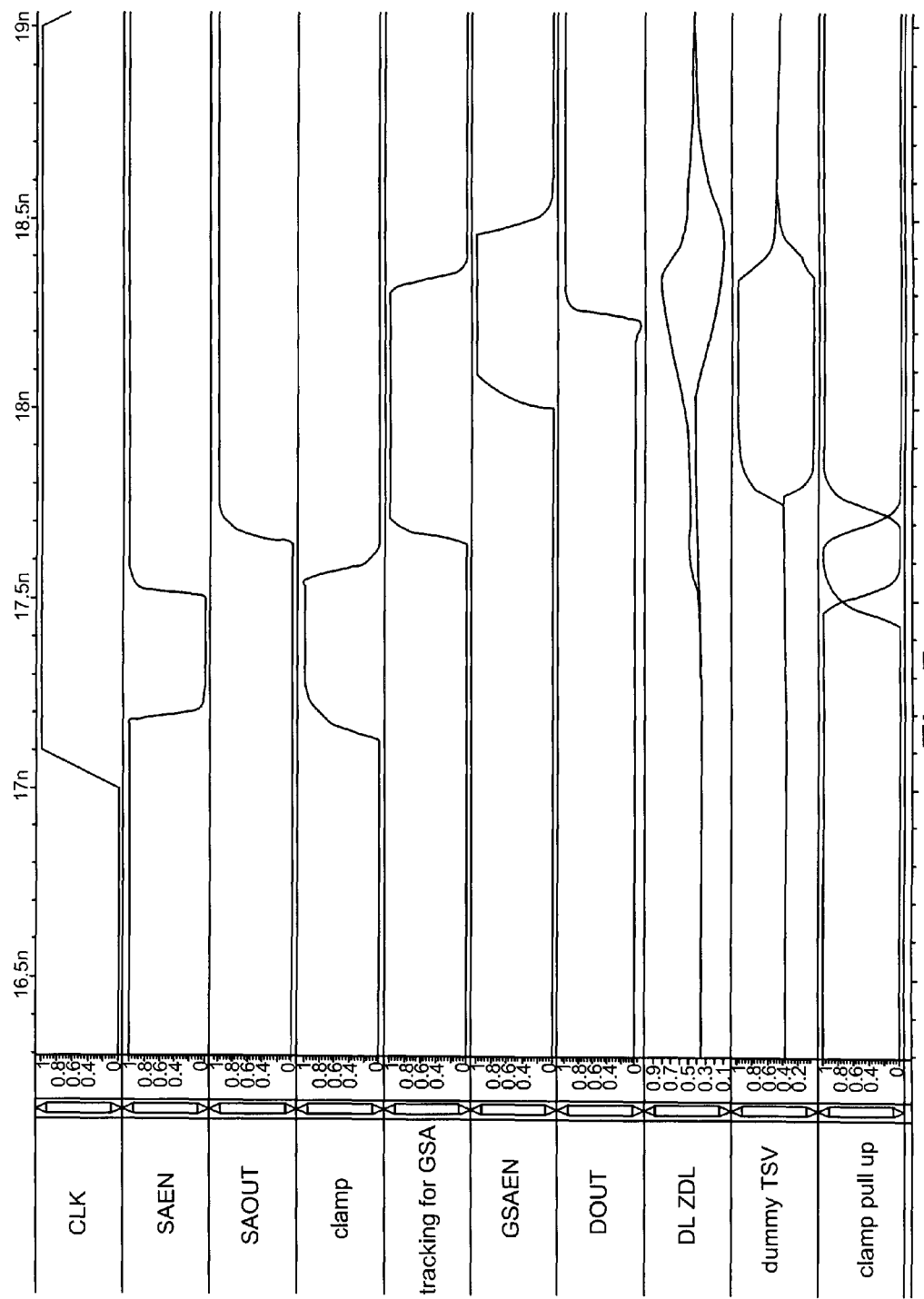
FIG. 5 illustrates an operation waveform of the 3D-IC differential sensing and charge sharing scheme according to the present invention.

As shown in FIG. 4, in the differential tracking process, two sense amplifiers 400, 410 are used for detecting. A pair of dummy TSV 240a, 240b are equaled (balanced) to the same voltage value by the equaling (balancing) circuit 250a, and followed by one dummy TSV is pulled to a high potential $V_{dd}$, and another dummy TSV is to ground (GND) for discharging. As the pair of dummy TSV 240a, 240b is in full swing, it indicates that others TSV (240c, 240d,) have sufficient voltage difference (with a drive ratio), and thereby sending GSAEN signal. The above operation procedure can be referred to the waveform, such as shown in FIG. 5.

Figure 6:
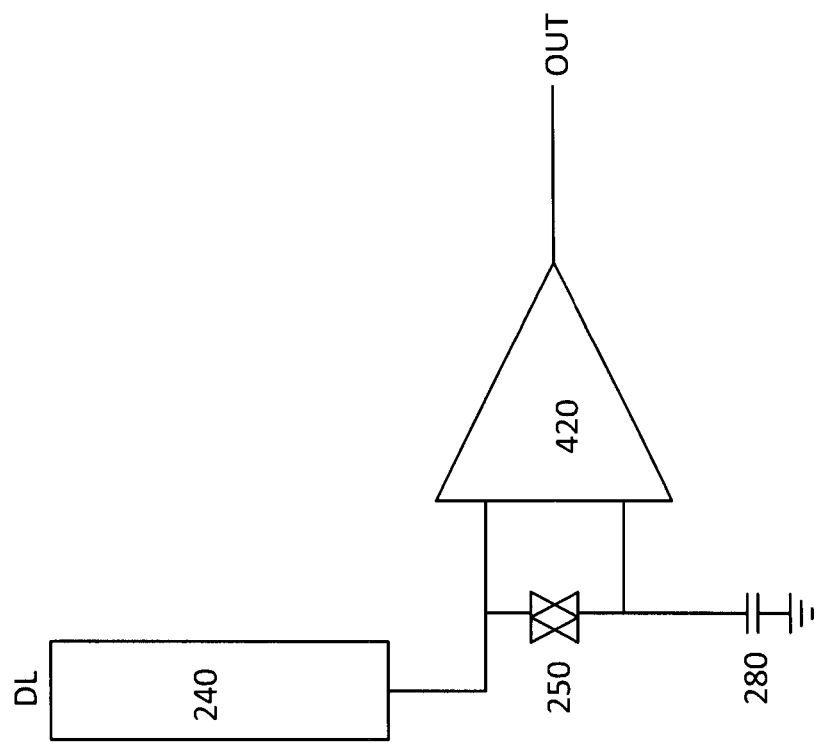
FIG. 6 illustrates another embodiment of the 3D-IC differential sensing and charge sharing scheme according to the present invention.
Figure 7:
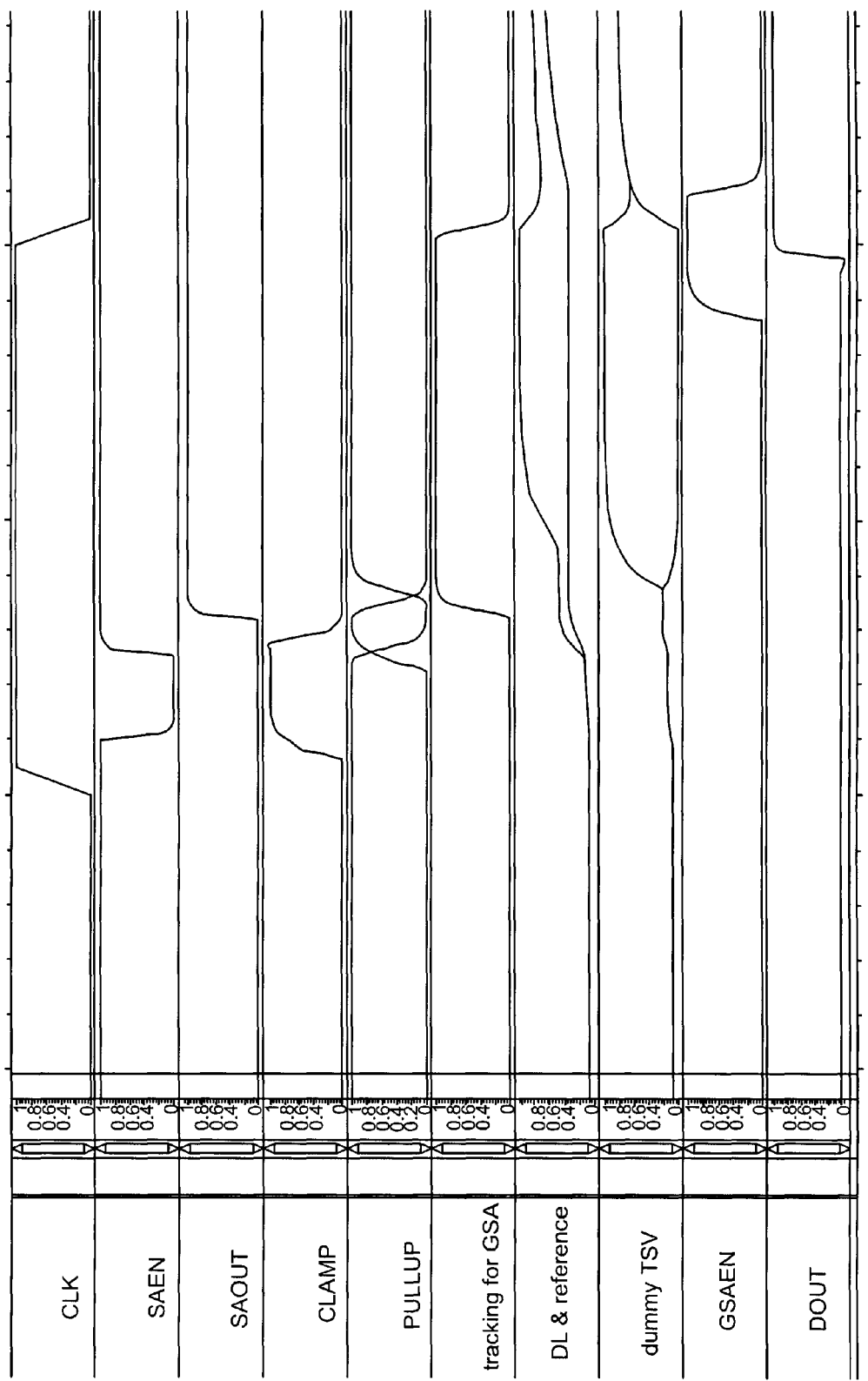
FIG. 7 illustrates an operation waveform of another embodiment of the 3D-IC differential sensing and charge sharing scheme according to the present invention.

As shown in FIG. 6, it shows another embodiment of a pseudo differential scheme according to the present invention. In this scheme, an equaling (balancing) circuit 250 is electrically connected to the positive input terminal and negative input terminal of a sense amplifier 420, and coupled to a dummy TSV (dummy loading) 240. A capacitor is electrically connected to one terminal of the equaling (balancing) circuit 250 and the negative input terminal of the sense amplifier 420 for storing charge. The charge-sharing flow of the 3D-IC scheme includes, firstly, in voltage equaling stage (i.e., opening the equaling circuit 250 stage), duplicating voltage to the other terminal of the sense amplifier 420, while maintaining an identical voltage at two terminal of the sense amplifier 420. Next, the equaling circuit 250 is closed. Data or signal is then transmitting via the TSV 240, while the voltage is pulled up or down. Subsequently, the tracking circuit provides signal, and then sensing the signal by a sense circuit (the sense amplifier 420). Sensing data is output from the sense amplifier 420. In this scheme, similarly, GSAEN signal is also output. The above operation procedure can be referred to the waveform, shown in FIG. 7. This scheme can reduce half number of the usage TSV and reduce more power consumption.

Generally speaking, in a traditional three-dimensional chip system, as the input/output (I/O) number of the circuit is large, pre-charge of TSV consume lots of power. In the scheme and method of the present invention, there is no need pre-charging for each TSV structure, and they design a tracking system for multi-layer sensing, to solve the above-mentioned problem.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A 3D-IC differential sensing and charge sharing scheme, comprising:
    a plurality of high loading structures, including a first high loading structure and a second high loading structure;
    a tracking circuit coupled to said first high loading structure,
    a sensing circuit coupled to said second high loading structure and said tracking circuit;
    a plurality of equaling circuits each of said plurality of equaling circuits arranged between an adjacent two high loading structures of said plurality of high loading structures adjacent said first equaling circuit and coupled thereto for balancing voltage of said adjacent two high loading structures to an identical voltage; and
    a clamping circuit coupled to said first high loading structure, wherein said clamping circuit comprises said two sensing amplifiers, a coupling capacitor, a current generator and a comparator, capable of clamping a lower level input signal to a pre-determined reference voltage level by utilizing said positive input terminal or said negative input terminal and comparing a voltage of a first TSV of said all TSV by said comparator;
    wherein said equaling circuits are used to equal output voltages of said two sensing amplifiers.

2. The scheme of claim 1, wherein said plurality of high loading structures are a plurality of TSVs.

3. The scheme of claim 1, wherein said tracking circuit includes a pair of dummy bit line and at least one tracking unit, said at least one tracking unit including a plurality of MOS transistors.

4. The scheme of claim 1, wherein said sensing circuit includes a sense amplifier, a comparator or an operational amplifier.

5. The scheme of claim 1, wherein said two sense amplifiers include a first sense amplifier and a second sense amplifier.

6. The scheme of claim 5, wherein a third terminal of said first sense amplifier and said second sense amplifier is electrically connected to said first high loading structure, and a second terminal of said first sense amplifier electrically connected to a first terminal of said second sense amplifier.

7. A 3D-IC differential sensing and charge sharing scheme, comprising:
    a high loading structure;
    a sensing circuit, coupled to said high loading structure;
    an equaling circuit used to equal output voltage of said sensing, coupled to a positive input terminal and a negative input terminal of said sensing circuit, and coupled to said high loading structure; and
    a capacitor, coupled to positive input terminal of said equaling circuit and said negative input terminal of said sensing circuit for storing charge;
    wherein charge-sharing flow of said 3D-IC differential sensing and charge sharing scheme includes duplicating voltage to said positive input terminal or said negative input terminal of said sensing circuit in voltage equaling stage by opening said equaling circuit, while maintaining an identical voltage at said positive input terminal and said negative input terminal of said sensing circuit for charge-sharing of said 3D-IC.

8. The scheme of claim 7, wherein said high loading structures is a TSV.

9. The scheme of claim 7, wherein said sensing circuit includes a sense amplifier, a comparator or an operational amplifier.

10. A method for charge-sharing of 3D-IC, comprising:
    equaling all TSV signals by a plurality of equaling circuits;
    opening a clamping circuit, wherein said clamping circuit includes said two sensing amplifiers, a coupling capacitor, a current generator and a comparator, utilizing said two sensing amplifiers and comparing a voltage of a first TSV of said all TSV by said comparator;
    equaling output voltage of said two sensing amplifiers and balancing voltage of an adjacent two high loading structures to an identical voltage by an equaling circuit of said plurality of equaling circuits;
    if said voltage of said first TSV exceeds a specified range, then sending a pulse control signal for pre-charging to said first TSV, and thereby supplementing charge in a circuit to maintain a first stable voltage; and
    opening a sensing circuit to output a sensing data or signal, and thereby determining a digital status as one or zero.

11. The method of claim 10, wherein said TSV signals include a differential tracking signal and a differential sensing signal.

12. The method of claim 10, further comprising clamping a lower level input signal to a pre-determined reference voltage level by said clamping circuit.

* * * * *